(12) United States Patent
Biber et al.

(10) Patent No.: US 8,766,632 B2
(45) Date of Patent: Jul. 1, 2014

(54) MAGNETIC RESONANCE DEVICE, REFLECTOR ARRAY AND HIGH-FREQUENCY SHIELD SYSTEM FOR A MAGNETIC RESONANCE DEVICE

(75) Inventors: Stephan Biber, Erlangen (DE); Jürgen Nistler, Erlangen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 315 days.

(21) Appl. No.: 13/240,026

(22) Filed: Sep. 22, 2011

(65) Prior Publication Data

US 2012/0068710 A1 Mar. 22, 2012

(30) Foreign Application Priority Data

Sep. 22, 2010 (DE) .......................... 10 2010 041 202

(51) Int. Cl.
*G01V 3/00* (2006.01)
(52) U.S. Cl.
USPC .......................................... 324/307; 324/322
(58) Field of Classification Search
USPC .......................... 324/300–322; 600/409–445
See application file for complete search history.

(56) References Cited

U.S. PATENT DOCUMENTS

| 4,638,253 | A | 1/1987 | Jaskolski et al. | 324/318 |
| 6,437,567 | B1 * | 8/2002 | Schenck et al. | 324/318 |
| 7,403,011 | B2 * | 7/2008 | Burdick et al. | 324/318 |
| 7,599,729 | B2 * | 10/2009 | Atalar et al. | 600/423 |
| 7,659,124 | B2 * | 2/2010 | Pusiol | 436/173 |
| 7,765,005 | B2 * | 7/2010 | Stevenson | 607/37 |
| 8,260,435 | B2 * | 9/2012 | Johnson et al. | 607/116 |
| 2001/0035504 | A1 | 11/2001 | Hayes | |
| 2008/0231276 | A1 | 9/2008 | Diehl et al. | 324/314 |
| 2010/0109667 | A1 | 5/2010 | Leussler | 324/318 |
| 2010/0213939 | A1 | 8/2010 | Sodickson et al. | |

FOREIGN PATENT DOCUMENTS

| CN | 85106858 A | 7/1986 |
| CN | 101675352 A | 3/2010 |
| DE | 10 2007 014 135 A1 | 9/2008 |
| WO | WO 2008/135943 A1 | 11/2008 |

OTHER PUBLICATIONS

German Office Action dated Jun. 9, 2011 for corresponding German Patent Application No. DE 10 2010 041 202.3 with English translation.
Chinese Office Action dated Dec. 3, 2013 for corresponding Chinese Patent Application No. 2013112801142420 with English translation.

* cited by examiner

*Primary Examiner* — Brij Shrivastav
(74) *Attorney, Agent, or Firm* — Lempia Summerfield Katz LLC

(57) ABSTRACT

A magnetic resonance device with a measurement chamber, an antenna arrangement that has a plurality of antenna elements arranged at least in certain areas around the measurement chamber, a gradient coil system arranged outside the antenna arrangement as seen from the measurement chamber, and a high-frequency shield system arranged between the antenna arrangement and the gradient coil system are provided. The high-frequency shield system has a reflector array with a plurality of passive reflector resonance circuits, each of which is configured such that resonance frequencies of the plurality of passive reflector resonance circuits lie below an operating magnetic resonance frequency of the magnetic resonance device and that the plurality of passive reflector resonance circuits has an inductive overall impedance.

20 Claims, 4 Drawing Sheets

A)

B)

A)

B)

MAGNETIC RESONANCE DEVICE, REFLECTOR ARRAY AND HIGH-FREQUENCY SHIELD SYSTEM FOR A MAGNETIC RESONANCE DEVICE

This application claims the benefit of DE 10 2010 041 202.3, filed on Sep. 22, 2010.

BACKGROUND

The present embodiments relate to a high-frequency shield system for a magnetic resonance device.

In a magnetic resonance device, a body to be examined using a basic field magnet system may be exposed to a relatively high basic field magnetic field of 3 or 7 tesla, for example. In addition, a magnetic field gradient is created using a gradient system. Via a high-frequency transmission system, high-frequency excitation signals (HF signals) are transmitted using suitable antenna devices that may result in the nuclear spins of particular atoms resonantly excited by this high-frequency field being tilted by a defined flip angle with respect to the magnetic field lines of the basic magnetic field. This high-frequency excitation or the resulting flip angle distribution is also called nuclear magnetization. During the relaxation of the nuclear spin, high-frequency signals (e.g., magnetic resonance signals) are emitted. The high-frequency signals are received and further processed by suitable receiving antennas. The desired image data may be reconstructed from the raw data acquired in this way. The transmission of the high-frequency signals for nuclear spin magnetization may be effected using a "bodycoil." A typical design for the body coil is a birdcage antenna that includes several transmission rods that are arranged running around a patient space (in which a patient is located during the examination) in the tomographic system parallel to the longitudinal axis. The antenna rods are each capacitively connected to one another in a ring shape on the end face. Apart from transmitting, this antenna may also be used to receive magnetic resonance signals.

Local coils may be used to receive the magnetic resonance signals and are applied directly to the body of the patient. The local coils may consist of a group of conductor loops (e.g., an antenna array), with the antenna conductor loops being individually operable. These antennas are designed with respect to antenna elements of the antennas such that the antenna elements may sensitively receive even low signals. The received low signals may be amplified and used as raw data. An antenna array such as this may form a relatively large surface antenna on the body of the examination object or patient.

By mounting the local coils close to the body, a maximized signal-to-noise ratio (SNR) may be obtained in the received signal and thus in the diagnostic information. Another advantage of an antenna array such as this with several individually operable conductor loops is that image acquisition is made significantly faster in the context of parallel imaging procedures and thus the exposure experienced by the patient may be reduced. By using spatially adjacent individual antenna elements, additional local information that complements the local resolution achieved by the gradient fields may be obtained. If the local coils are appropriately designed and wired, the local coils may also be used to transmit.

Mounting local coils close to the body also has certain practical disadvantages. Firstly, compared with other imaging modalities such as, for example, computed tomography systems, a great deal of additional time is needed when mounting the local coils. As a result, the magnetic resonance devices are busy for longer and are not available for other examinations. In addition, this extra waiting time may at least impose psychological stress on the patient. Secondly, mounting local coils on the body is uncomfortable and restrictive for the patient and, in extreme cases, may make examinations not only more protracted but even impossible. Thirdly, the local coils are wired in the patient table to the receiving devices of the magnetic resonance device. This wiring generates considerably higher costs when manufacturing a magnetic resonance device. The plugs and cable at the local coils are susceptible to abrasion. Because of these disadvantages, a technical solution for replacing local coils with antennas located further away from the body that may be mounted on the system side in the magnetic resonance tomography device rather than directly on the patient is desired.

Such a remote-body array (RBA) of individual receiving antennas is described, for example, in U.S. Ser. No. 12/392, 537. It has been shown that as a result of the relatively large distance of such an RBA from the patient's body, both the induced MR received signal and the noise received from the patient's body is very small. Hence, the overall noise in the remote-body receiving coils is dominated by the thermal inherent noise of the loss resistors in the local coils. To be able to achieve a better signal-to-noise ratio, the inherent noise of the receiving antennas is to be reduced, either by reducing loss resistors of the receiving antennas or a temperature of the receiving antennas. U.S. Ser. No. 12/392,537 proposes to implement an RBA with extremely low inherent noise by cooling (e.g., with helium or nitrogen) or by using superconductors (e.g., high-temperature).

Also, the mirror currents that develop on a high-frequency shield that may be arranged between a transmitting or receiving antenna and the gradient coil mounted radially further outward, is a problem. This high-frequency shield is provided in order to shield the gradient coil from the high-frequency fields of the antenna arrangement. Such high-frequency shields between the bodycoil (e.g., the birdcage antenna) and the gradient coil system are also used in the magnetic resonance devices without RBA, which are standard in the art. These high-frequency shields may be designed in the form of slotted metal shield surfaces with two slotted shield surfaces being located in each case on different sides of a flexible printed circuit, and the slots in each case being arranged such that the slots are offset with respect to one another. The slots of one of the two shield surfaces are covered by the metal surface of the other shield surface, and vice versa. The slots may be bridged with capacitors that are conductive for high frequency but largely have a blocking effect for the frequencies of the gradient system. This provides that the high-frequency fields of the antenna are shielded from the gradient coil as desired, but the shield is transparent for the low-frequency gradient fields. These shield surfaces have an unavoidable surface resistance that in part causes feedback of the mirror currents on the HF shield into the antenna elements and thus when receiving, contributes to additional thermal noise in the antenna elements. This problem, by nature, becomes all the more critical if not only one transmitting antenna is used in the vicinity of the high-frequency shield, but an RBA with a plurality of receiving antenna elements is to be integrated there, and these antenna elements are to be extremely low-loss.

To reduce the losses in the high-frequency shield, the distance between the antenna arrangement and the high-frequency shield may be increased. However, because of the radial space present within the available inner chamber of a modern magnetic resonance scanner, this approach is of limited help, since either the diameter of the measurement chamber that is usable for the patient becomes smaller, which dramatically reduces patient comfort, or the basic field magnet is larger in size, resulting not only in higher costs, but also in problems when setting up the devices.

SUMMARY AND DESCRIPTION

The present embodiments may obviate one or more of the drawbacks or limitations in the related art. For example, a magnetic resonance device with a modified high-frequency shield system that is low-loss, reliably prevents the coupling of a high-frequency antenna arrangement with a gradient coil system, and allows the gradient fields to pass, may be provided.

According to the present embodiments, the magnetic resonance device is fitted with one embodiment of a high-frequency shield that includes a reflector array with a plurality of passive reflector resonance circuits (also called "reflector elements" in the following). The term "passive" may be that the reflector elements resonate passively with the antenna elements if a current is induced therein, for example, on receipt of the magnetic resonance signals or if a signal is transmitted by the antenna elements. The reflector elements are to be designed to be free-floating (e.g., without any link to a fixed potential). According to the present embodiments, the reflector elements are each designed such that resonance frequencies of the reflector elements lie below an operating magnetic resonance frequency of the magnetic resonance device and such that the reflector elements have an inductive overall impedance. This provides that the series impedance including capacitance and inductance of the respective reflector resonance circuit is overall inductive. If the reflector elements are precisely in resonance, the secondary current induced in the reflector elements may be a multiple of the current in the primary antenna elements. Because of the low off-resonance setting of the reflector elements compared to the operating magnetic resonance frequency used of the magnetic resonance device, the current in the reflector resonance circuits is reduced to the dimension required for the shielding. As the overall impedance is inductive, the current within the reflector array always flows in the opposite direction to the current in the antenna element and thus provides an excellent shielding effect.

Operating magnetic resonance frequency may be the magnetic resonance frequency, with which the respective magnetic resonance device works. In a 1.5-tesla magnetic resonance device, the operating magnetic resonance frequency may be a frequency of 63.6 MHz, at 2.9 tesla, 123.2 MHz, and at 7 tesla, 300 MHz, providing an excitation of the hydrogen nuclei is to take place as normal.

As in such reflector arrays for shielding the high-frequency signals of the antenna elements, very low capacitances of, for example, a few 10 pF are used (in contrast to the capacitances of a few nF used for full-surface slotted high-frequency shields), low currents are induced by the gradient pulses in the reflector elements, and the induced currents do not interfere with the gradient pulses so that the reflector array is virtually transparent for the gradient pulses. This has the advantage that besides the gradient-induced vibration in the high-frequency shield system, the heat recorded at the reflector arrays is reduced, which, for example, may be useful for being able to implement a cryogenically cooled high-frequency shield system.

The claims in one category may be developed analogously to the claims in one of the other categories.

The reflector resonance circuits may at least consist of a conductor loop that has a capacitance and an inductance of the appropriate size, so that conditions described above with respect to the (inherent) resonance frequency and the overall impedance are satisfied. The conductor loop may already have a sufficient impedance so that additional impedances are not necessary. Suitable capacitive elements may, for example, be introduced into the conductor loop at one or more points. However, the conductor loops may not be wired using concentrated capacitors but are operated using distributed capacitance (e.g., the conductor loops are designed in terms of a shape and an arrangement so that besides the desired inductance, the conductor loops also have the requisite capacitance).

In one embodiment, a reflector resonance circuit has a plurality of windings (e.g., a spiral multiply circumferential conductor loop), as will be explained in greater detail below.

In another embodiment, the reflector array has reflector resonance circuits electrically separated from one another. In the reflector array, consisting of individual reflector elements, a separate reflector element may be assigned in each case to individual antenna elements of the antenna arrangement. The individual reflector elements may each have a similar design to the antenna elements assigned to the individual reflector elements. If the antenna elements are designed, for example, as individual conductor loops, the reflector array may have a reflector element conductor loop appropriate thereto, which is approximately shaped in accordance with the conductor loop of the antenna element and runs at least approximately in parallel thereto.

In order to achieve a particularly good shielding effect, the reflector elements may also, for example, be configured such that a current density distribution of the reflector elements approximates the spatial structure of the surface current density of an imagined continuous metal wall. It is advantageous to embody the dimensions of the shielding elements (e.g., the diameter and the effective conductor width) as somewhat larger than the respectively assigned antenna elements, the ideal dimensions also depending on the distance between reflector element and antenna element. Such a larger effective conductor width may, for example, also be implemented with the previously described reflector resonance circuits with multiple windings (e.g., spiral conductor loops). By dividing the overall conductor width into narrow individual conductor paths, gradient eddy currents are well suppressed.

In one embodiment, the reflector array includes a network of connected reflector resonance circuits. Adjacent reflector resonance circuits of the reflector array may be connected at a boundary edge via a common conductor path (e.g., for the boundary between two reflector resonance circuits to be formed by a conductor path that is used by both reflector resonance circuits). Series capacitances are arranged in the conductor path boundary edges (e.g., the partitions of the network).

In the network of connected reflector elements, the field in each case bulges outward and then inward again in the vicinity of the edge in the middle of each mesh of the network (e.g., in the middle of each reflector resonance circuit). These evanescent magnetic near fields disappear exponentially as the distance from the network increases. A sufficient distance for these fields not to have any further effect on the antenna elements already occurs, for example, at a distance of 2 to 3 mesh widths. It is advantageous if, in the case of such a design, it is provided that the reflector resonance circuits have smaller dimensions (e.g., smaller diameters) than the antenna elements. In one embodiment, the number of reflector elements is also greater than that of the antenna elements. A small-cell design of the reflector array with multiple and smaller reflector coils than receiving coils is then advantageous. Such a two-dimensional network of meshes may also be implemented as a non-powered bandpass birdcage coil.

The embodiment with a connected network of reflector elements (e.g., as a non-powered bandpass birdcage) is suitable if the antenna arrangement is likewise formed by a multimode bandpass birdcage (also called a "degenerate birdcage"). The design of the reflector array is analogous to that of the antenna arrangement, except that the reflector array is not powered. The reflector array is arranged in a larger radius between the antenna arrangement and the gradient coil system, and the conditions with respect to the resonance frequency and the overall inductance are satisfied.

The antenna arrangement may act as a receiving antenna arrangement. It is important for the antenna elements to have a low inherent noise and not to be disrupted by noise interference from mirror currents induced in the lossy high-frequency shield. The antenna arrangement may accordingly also be designed as a receiving antenna arrangement with respect to the other components and has electronic components and conductor paths that are designed for low output powers, so that received signals are minimized. The antenna arrangement may have suitable preamplifier components. The antenna arrangement may also be used to transmit magnetic resonance signals if the antenna arrangement is wired appropriately. The antenna arrangement may also be spatially integrated as a pure receiving antenna arrangement into another antenna arrangement (e.g., a transmitting antenna arrangement).

It may be advantageous to integrate transmitting and receiving antenna in order to give the receiving antenna more space for the field reflux and to avoid additional losses through HF eddy currents and couplings to the transmitting antenna deactivated during reception.

In order to prevent the penetration of the reflector near fields into the gradient coils that are very strongly lossy for high frequency, a conventional metal shield may also be mounted on the gradient coil surface in addition to the resonant reflector array. This provides that the high-frequency shield system has at least one second high-frequency shield between the reflector array and the gradient coil system. As the near fields of the reflector elements drop outward much more steeply than the fields of unshielded antenna elements do, the contribution of loss or noise by the gradient shield to the antenna arrangement is considerably reduced by the reflector array (e.g., even in a case with a normal high-frequency shield, the reflector array of the present embodiments provides that the noise in the antenna elements becomes considerably less). The high-frequency shield system may shield the gradient coils working at a lower frequency even better from the high-frequency fields.

Where the antenna arrangement to reduce the inherent noise is cooled inside a cryostat container, as is proposed in U.S. Ser. No. 12/392,537, it is advantageous if the reflector array is also arranged in the cryostat container as well as the antenna arrangement.

DETAILED DESCRIPTION OF THE DRAWINGS

Figure 1:
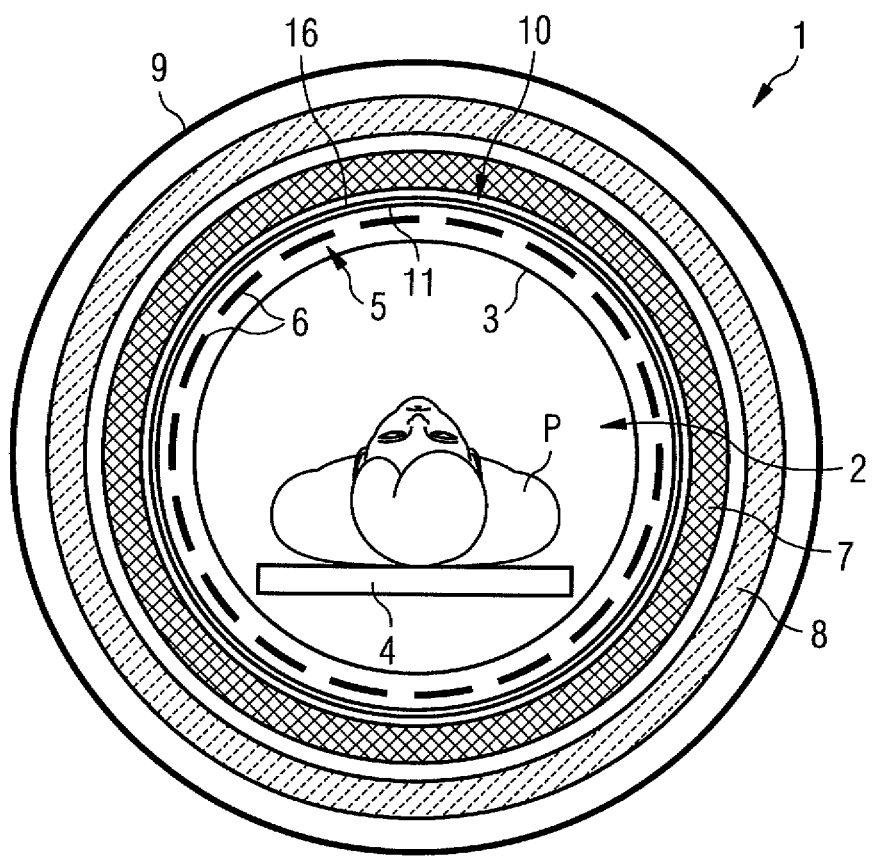
FIG. 1 shows a cross-section through a scanner housing of one embodiment of a magnetic resonance tomography device.

FIG. 1 shows a section through a scanner of one embodiment of a magnetic resonance device 1. Various components are arranged inside a scanner housing 9, with a measurement chamber 2 (e.g., a patient tunnel or a "bore") being left free right in the center. An examination object (e.g., a patient P) is arranged in the measurement chamber 2 on a couch 4. The couch 4 is motorized and may travel inside the measurement chamber 2 in a longitudinal direction or may be conveyed out of the measurement chamber 2 in order to position the patient P. The measurement chamber 2 is delimited by an interior wall 3 of the scanner housing 9, the wall 3 including, for example, a plastic tube (e.g., made of fiber glass). The interior wall 3 may also be called a "support tube" 3, since an antenna structure of a body coil may also be mounted on the interior wall 3.

At a short radial distance outward or immediately on the support tube 3 is an antenna arrangement 5 (e.g., an RBA 5) with a plurality of individual antenna elements 6. The RBA 5 may be used to receive magnetic resonance signals from the body of the patient P. In addition, a transmitting/receiving antenna (e.g., a conventional birdcage antenna) may be arranged (not shown in FIG. 1) in the scanner in the immediate vicinity of the receiving antenna arrangement 5 or may be structurally integrated with the receiving antenna arrangement 5 on a support (e.g., the support tube). One embodiment of a high-frequency shield system 10 with one embodiment of a reflector array 11 is radially outside the antenna arrangement 5. The reflector array 11 is explained again below in greater detail. The high-frequency shield system 10 is used to shield a gradient coil system 7 lying further outward from the high-frequency signals. Of the gradient coil system 7, only a circular circumferential gradient coil for the gradient formation in the z-direction (in the longitudinal direction of the scanner or of the patient) is shown in FIG. 1. The gradient coil system may have other gradient coils, not shown in FIG. 1, that are arranged in the scanner housing 9 in order to create magnetic field gradients in the other spatial directions perpendicular to the z-direction. Radially outside the gradient coil system 7 is a basic field magnet 8 that provides the basic magnetic field.

The other components of the magnetic resonance device 1 include control devices for appropriately controlling the basic field magnet and the magnetic field gradients. The other components of the magnetic resonance device also include high-frequency transmitting devices for generating and amplifying the high-frequency pulses in order to transmit the high-frequency pulses via the antenna arrangement, and corresponding receiving devices to be able to receive, amplify and further process magnetic resonance signals from the measurement chamber or the examination object via the antenna arrangement(s). The transmitting and receiving devices may also have ports to enable external local coils to be connected. The external local coils are laid on, under or at the examination object and may also be conveyed into the measurement chamber 2 of the magnetic resonance device 1.

These components and corresponding modes of operation of these components are, however, known to the person skilled in the art and are not shown in FIG. 1 for reasons of clarity. The present embodiments may be used not only with magnetic resonance devices that have a cylindrical patient tunnel, but also with differently designed magnetic resonance devices (e.g., with a measurement chamber open on three sides). Accordingly, the antenna arrangement and the reflector array are adjusted.

In one embodiment, the RBA 5 is not, as shown in FIG. 1, configured completely around the measurement chamber 2. Instead, the RBA 5 is, for example, configured only in a top part. For the arrangement of the RBA 5 in a lower region, the RBA 5 is configured underneath the couch 4, and corresponding local coils are arranged inside the structure of the couch 4 so that in this region, the receiving antennas are nearer to the patient. The reflector array 11 may also be correspondingly adjusted.

Figure 2:
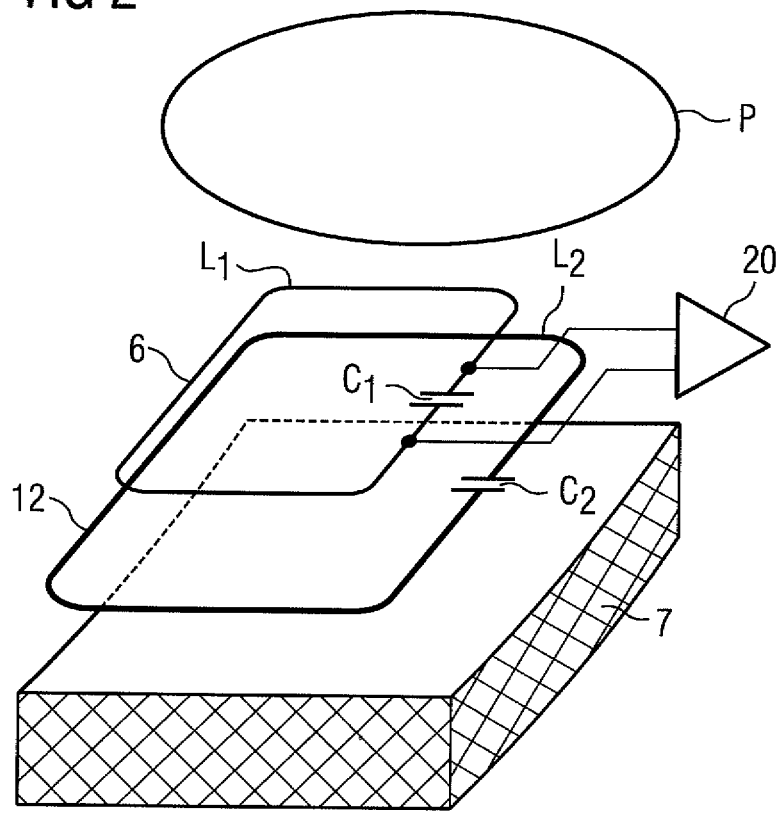
FIG. 2 shows a perspective view of an antenna element with an associated reflector element of one embodiment of a reflector array.

FIG. 2 shows one embodiment of an antenna element 6 of an RBA, a simple antenna conductor loop 6 that has an inductance $L_1$. The conductor loop 6 is open at one point and is closed at the one point by a capacitance $C_1$. The magnetic resonance signal received by the antenna element 6 is tapped via the capacitance $C_1$ and is amplified in a preamplifier 20 before being passed to another receiving and further processing device of the magnetic resonance device. FIG. 1 also diagrammatically shows a part of the gradient coil system 7 at a distance underneath the antenna element 6. One embodiment of a reflector element 12 or a reflector resonance circuit 12 of a reflector array 11 is shown between the antenna element 6 and the gradient coil system 7. The reflector element 12, like the antenna element 6, is designed as a simple conductor loop that is interrupted at one point by a capacitance $C_2$. However, unlike the antenna element 6, the conductor loop of the reflector element 12 is not connected to a receiver or other components but is free floating on an undefined potential, so that the conductor loop of the reflector element 12 resonates passively whenever a current is induced in the conductor loop of the antenna element 6.

As shown in the embodiment of FIG. 2, the conductor loop of the reflector element 12 is designed such that the conductor loop has a similar design to the conductor loop of the antenna element 6. The inductance $L_2$ and the capacitance $C_2$ of the conductor loop of the reflector resonance circuit 12 may be selected such that the condition $$\frac{1}{2\pi\sqrt{L_2 C_2}} < f_{MR} \quad (1)$$

is satisfied, where $f_{MR}$ is the operating magnetic resonance frequency of the magnetic resonance device (e.g., the frequency that the antenna elements 6 should receive and to which the antenna elements 6 are precisely tuned with respect to an inductance $L_1$ and a capacitance $C_1$ of the antenna elements 6). This may be achieved by selecting the capacitance $C_2$ of the reflector element 12 to be larger than would be necessary for a resonant tuning to the operating magnetic resonance frequency $f_{MR}$. The capacitive impedance is also smaller than the inductive impedance, and thus, the series impedance of the reflector element 12 is inductive overall.

This automatically provides that during a resonance of the reflector resonance circuit 12 with the antenna element 6, the current in the reflector resonance circuit 12 always flows in the opposite direction to that in the antenna element 6. As a result, the effect of the current in the antenna element 6 on the gradient coil 7 is greatly reduced by the reflector resonance circuit 12 of the reflector array 11 and in the most favorable case, may be nullified.

When designing the reflector elements, the choice of the length of the conductor path may initially provide that the natural resonance of the reflector resonance circuit 12 lies in the range of the desired frequency. To this end, the conductor path length may be approximately comparable to half the wavelength of the desired frequency. The resonance frequency may be tuned by selecting the capacitance $C_2$ depending on the inductance of the conductor loop such that the current in the conductor loop of the reflector element 12 approximately corresponds to the antenna current, in order to minimize the effect of the current in the antenna element on the gradient coil system, since the current in the reflector element flows in the opposite direction to that in the antenna element.

In the exemplary embodiment shown in FIG. 2, each antenna element 6 of the RBA is assigned one corresponding reflector element 12 of the reflector array 11. The reflector array 11 consists, in each case, of individual elements that have a similar design to the actual antenna elements. To maximize the shielding effect, the reflector elements are configured, as shown in FIG. 2, such that current density distribution of the reflector elements approximates the spatial structure of the surface current density of an imagined continuous metal wall.

This is possible in that, as shown in FIG. 2, firstly the diameter of the conductor loop of the reflector element 12 is larger than the diameter of the antenna element 6. If, for example, the diameter of the antenna element 6 is approximately 10 cm, and the distance between the antenna element 6 and the reflector element 12 is approximately 1 cm, the diameter of the reflector element 12 may be approximately 11 cm.

Secondly, the effective conductor width of the reflector element 12 is embodied as larger than that of the antenna element 6. This may be achieved in that the width of the conductor path of a simple conductor loop of the reflector element 12 is designed to be wider.

Figure 3:
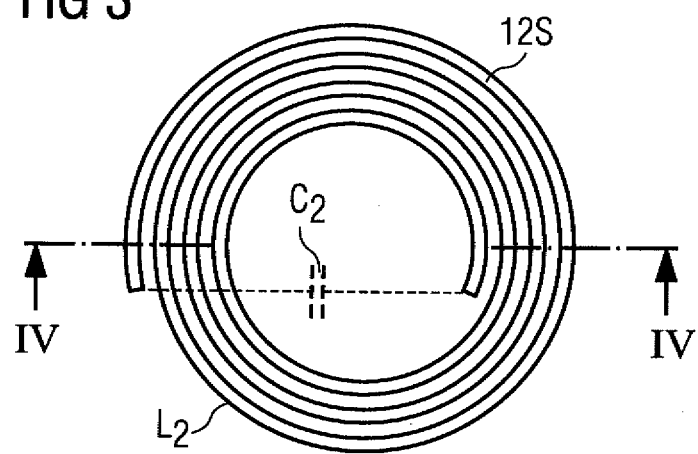
FIG. 3 shows a top view of one embodiment of a reflector element with a spiral conductor path.

Such a larger effective conductor width may, however, also be implemented with coils including multiple windings (e.g., with a spiral coil 12s), as shown in FIG. 3. An outer end and an inner end of the spiral conductor path of this spiral coil 12s may be connected via a capacitor to a predefined capacitance $C_2$, so that the spiral coil 12s has the desired inherent resonance frequency as a result of the inductance $L_2$ of the conductor path and because of the capacitor $C_2$.

Instead of the concentrated capacitors $C_2$, distributed capacitances may be used (e.g., for the coil shape to be selected such that the desired capacitance is present). In the case of superconducting resonators, for example, such a naturally resonant operation is advantageous, since the entire resonator structure may be designed to be superconducting, and no lossy capacitances are to be connected. In comparison to concentrated capacitors, the electrical fields may extend further. However, this is not a disadvantage, since the electrical fields barely penetrate out from the reflector elements 12 into the patient space.

The conductor path of the coil may be embodied, for example, in the case of spiral reflector elements 12, as in FIG. 3, such that suitable capacitances are formed between the conductor path circuits that are sufficient for the overall capacitance and the overall inductance to result in the desired resonance frequency of the reflector element.

The shielding effect of a spiral reflector element 12s in comparison with a high-frequency shield with a continuous metal surface M is described below on the basis of FIGS. 4 and 5.

Figure 4:
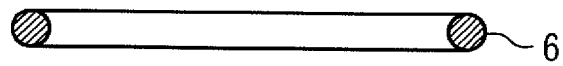
FIG. 4 shows a) a sectional view of one embodiment of an individual antenna conductor loop at a distance above a metal surface; and b) associated azimuthal current densities in the conductor loop (top) and the metal surface (bottom)
Figure 4:
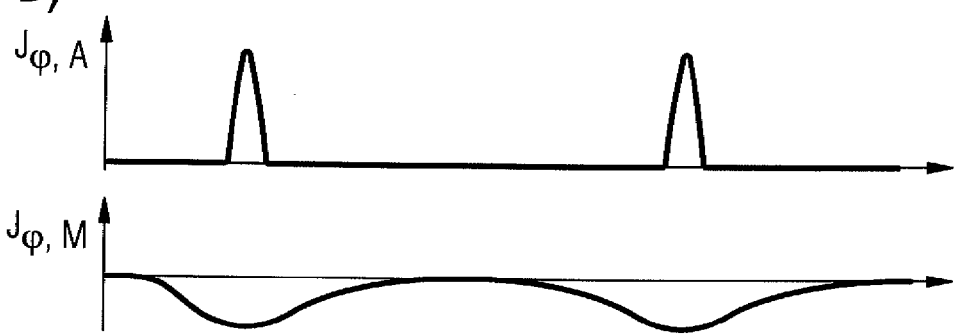

The top of FIG. 4 shows a) a section through a simple conductor loop of an antenna element 6 at a distance above a metal surface M of a conventional high-frequency shield. The bottom of FIG. 4 shows b) the azimuthal current density $I_{\phi,A}$ in the antenna element 6 (top diagram) and the azimuthal current density $I_{\phi,M}$ in the metal surface M (bottom diagram). The relatively high current density in the conductor path of the antenna element 6 is shown and corresponding to this, a more attenuated and broadened mirror current in the metal surface M is shown.

Figure 5:
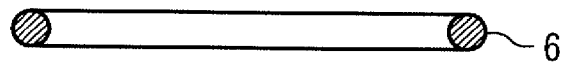
FIG. 5 shows a) a sectional view of an individual antenna conductor loop at a distance above one embodiment of a reflector element according to FIG. 3; and b) associated azimuthal current densities in the conductor loop (top) and the reflector element (bottom)
Figure 5:
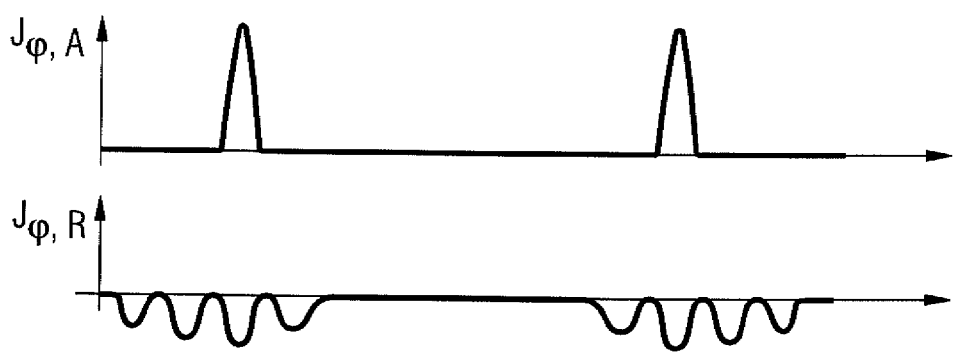

FIG. 5 shows, in comparison to this, again in the top diagram a) the cross-section through the antenna element 6 at a distance above a reflector element 12 according to FIG. 3 with four windings (along the section IV-IV in FIG. 3). The bottom part of FIG. 5 shows b) the azimuthal current density $I_{\phi,A}$ in the antenna element 6 (top diagram) and the azimuthal shield current density $I_{\phi,R}$ in the reflector element 12 (bottom diagram). The current strength drops relatively sharply from inside to outside (e.g., from the windings lying in the middle to the windings lying completely inside or completely outside). The current density consequently varies from 0 at the edges of the conductor path group of the reflector element 12 to a maximum in the middle of the conductor path group. Thus, the desired shield current density is emulated as well as possible to that of a metal surface M (see FIG. 4). This is achieved if the spiral coils are not (as shown only optionally in FIG. 3) designed with concentrated capacitors, but with distributed capacitances (e.g., are operated close to the natural resonance).

Figure 6:
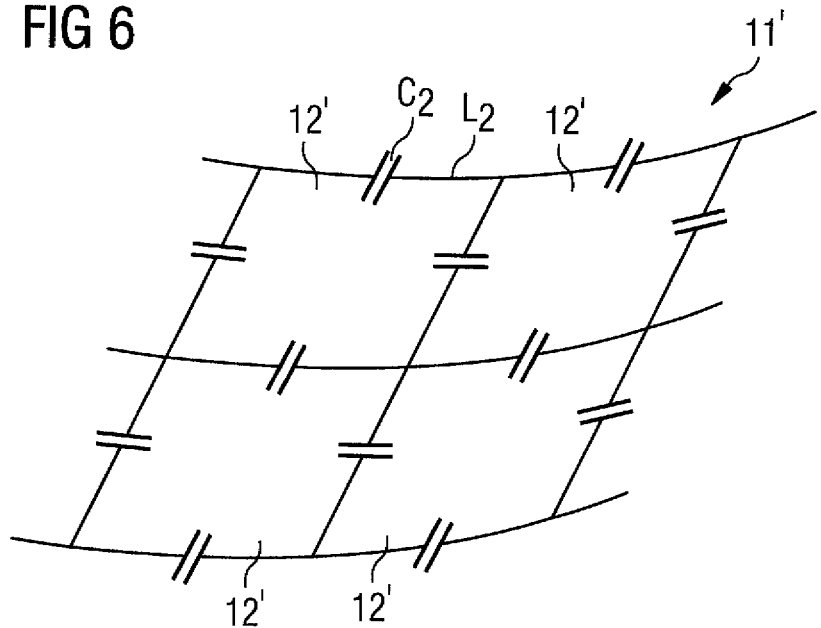
FIG. 6 shows one embodiment of a reflector array in the form of a meshed network.

FIG. 6 shows an alternative embodiment of a reflector array 11'. The reflector array 11' may be used if the antenna arrangement is also embodied in a shape other than the one described in connection with FIG. 2.

For example, a receiving antenna array may also be formed by a multi-mode bandpass birdcage, as already mentioned previously. The reflector array may also be executed analogously as a non-powered bandpass birdcage. The reflector array 11' forms a two-dimensional network of meshes with capacitors $C_2$ connected in series in the partitions, as shown in FIG. 6. The individual reflector elements 12' thus adjoin one another, and at the edges at which the individual reflector elements 12' adjoin one another, the adjoined individual reflector elements 12' have a common conductor path that forms the partitions of the network. The inductances $L_2'$ predefined by the conductor paths and the capacitances $C_2'$ of the capacitors arranged in the partitions may be selected such that the conditions referred to above in connection with equation (1) are satisfied.

Since, as already mentioned above, evanescent magnetic near fields still remain with a structure of this type, but disappear exponentially with increasing distance, a small-cell structure of the reflector array may be used.

Figure 7:
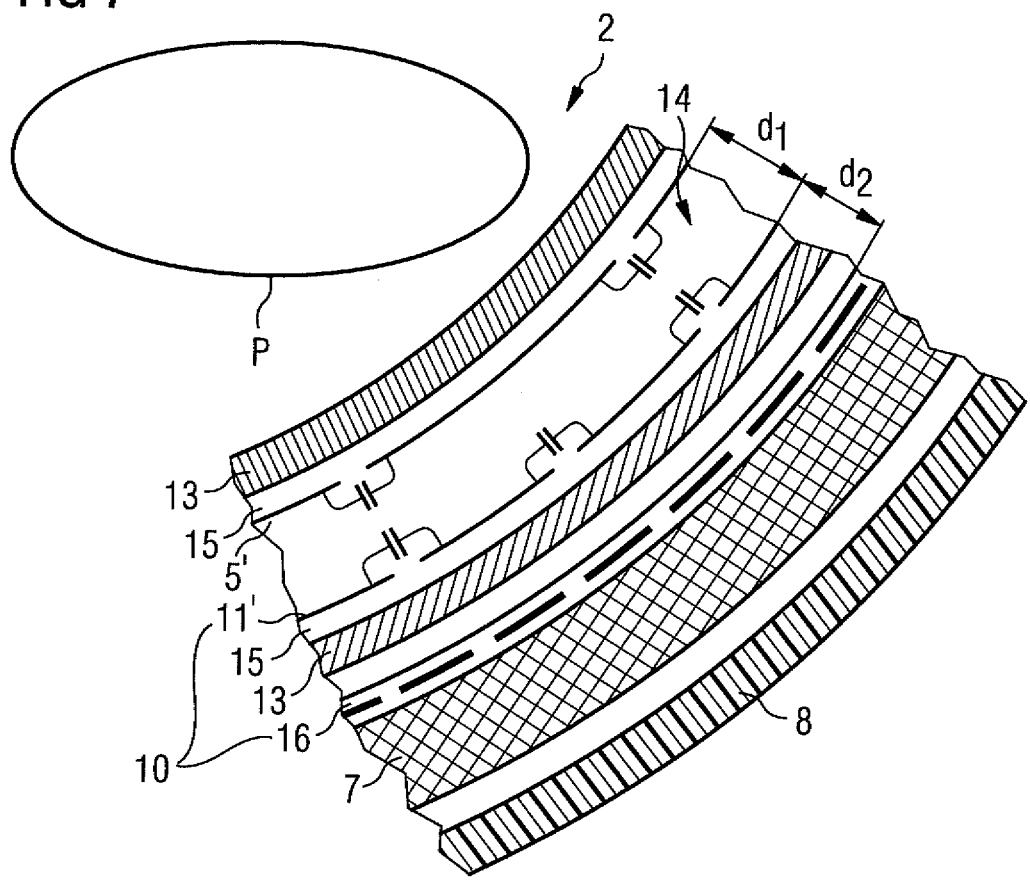
FIG. 7 shows a partial section through the structure of one embodiment of a cooled antenna arrangement with an associated reflector array and an additional high-frequency shield.

To minimize the reflector near fields penetrating into the gradient coils that are highly lossy for high frequency, a conventional metal shield on the gradient coil surface may be used in addition to the resonant reflector array 11, 11' in the high-frequency shield system 10. This is shown in FIG. 7. The basic field magnet 8 is shown on the outside, and a gradient coil 7, on which a conventional high-frequency shield 16 formed, for example, by slotted conductor surfaces, is located radially inward from the basic field magnet 8. The high-frequency shield 16 may be mounted directly on the inside of the gradient coil 7. Unlike in a conventional design, one embodiment of a reflector array 11', as shown, for example, in FIG. 6, is located between the antenna arrangement 5 (e.g., a multi-mode bandpass birdcage), and the conventional high-frequency shield 16. As the near fields of the reflector array drop much more steeply outward than the fields of unshielded antenna arrangements, the contribution to loss or noise of the conventional high-frequency shield may be considerably reduced on the gradient coil because of the reflector array. The undesired influence of mounting-related distance tolerances for the gradient coil on the resonance frequency of the antenna arrangement is also reduced.

FIG. 7 also diagrammatically shows that the antenna arrangement 5 is cooled jointly with the reflector array 11' in a cryostat. The interior wall that separates the antenna arrangement 5 from the measurement chamber 2 and the patient P is, for example, configured as a cryostat wall. A further wall of the cryostat 13 is located between the reflector array 11 and the conventional high-frequency shield 16, which may be mounted directly on the gradient coil 7. The whole interior space of the cryostat 13 between the two walls is evacuated, and both the antenna arrangement 5 and the reflector array 11' are mounted such that the antenna arrangement 5 and the reflector array 11' do not come into contact with the walls of the cryostat 13. In each case, a vacuum gap 15 remains in order to minimize heat bridges between the antenna structure 5 or the reflector array 11' and the cryostat walls.

A distance $d_1$ between the antenna arrangement 5 and the reflector array 11' may be selected such that a compromise is found between aspects flowing in the opposite direction. The distance $d_1$ may be relatively large in order to increase the field reflux space 14 between the antenna arrangement 5 and the reflector array 11' and thus to achieve a higher efficiency of the antenna arrangement 5. With a predefined overall thickness, the distance $d_2$ between the reflector array 11' and the conventional high-frequency shield 16 at the gradient coil 7 becomes smaller, so that the contribution to noise coupled in by near fields of the conventional gradient shield 16 may rise. However, the trend is that the antenna arrangement 5 and the reflector array 11' may in any case be closer to one another, if both, as shown in FIG. 7, are cooled or are also superconducting.

The design shown in the figures is merely an exemplary embodiment, and the basic principle of the antenna array of the present embodiments may also be varied without going beyond the scope of the invention, where the invention is defined by the claims. The features from the various exemplary embodiments above may be combined (e.g., arranging a reflector array composed of discrete individual reflector elements jointly with a corresponding antenna arrangement with individual conductor loops as antenna elements inside a cryostat). All technologies for the antenna arrangement described in U.S. Ser. No. 12/392,637 cited in the introduction may also be used in the structures described here. The contents of that document are incorporated here, which provides that the antenna arrangement may, for example, consist of normal conductive structures of cooled highly conductive materials or also of superconductors.

The described reflector arrays may be used not only with pure receiving antennas, but also advantageously for transmitting antennas or antenna arrays. In this case, the excellent transparency for gradient fields comes to the fore.

The use of the indefinite article "a" or "an" does not exclude the possibility of the features in question being present more than once.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance device comprising:
a measurement chamber;
an antenna arrangement comprising a plurality of antenna elements arranged at least in areas around the measurement chamber;
a gradient coil system arranged outside the antenna arrangement as viewed from the measurement chamber; and
a high-frequency shield system arranged between the antenna arrangement and the gradient coil system,
wherein the high-frequency shield system comprises a reflector array having a plurality of passive reflector resonance circuits, each passive reflector resonance circuit of the plurality of passive reflector resonance circuits being configured such that resonance frequencies of the plurality of passive reflector resonance circuits lie below an operating magnetic resonance frequency of the magnetic resonance device and that the plurality of passive reflector resonance circuits has an inductive overall impedance.

2. The magnetic resonance device as claimed in claim 1, wherein a passive reflector resonance circuit of the plurality of passive reflector resonance circuits has multiple windings.

3. The magnetic resonance device as claimed in claim 2, wherein the passive reflector resonance circuit has a spiral multiply circumferential conductor loop.

4. The magnetic resonance device as claimed in claim 1, wherein the reflector array has passive reflector resonance circuits of the plurality of passive reflector resonance circuits separated from one another.

5. The magnetic resonance device as claimed in claim 4, wherein individual antenna elements of the plurality of antenna elements of the antenna arrangement are each assigned a separate passive reflector resonance circuit of the passive reflector resonance circuits.

6. The magnetic resonance device as claimed in claim 5, wherein the passive reflector resonance circuits each have larger dimensions than the individual antenna elements assigned to the passive reflector resonance circuits.

7. The magnetic resonance device as claimed in claims 1, wherein the reflector array comprises a network of connected passive reflector resonance circuits of the plurality of passive reflector resonance circuits.

8. The magnetic resonance device as claimed in claim 7, wherein adjacent reflector resonance circuits of the reflector array are connected at a boundary edge via a common conductor path, into which a capacitance is inserted.

9. The magnetic resonance device as claimed in claim 7, wherein the connected passive reflector resonance circuits have smaller dimensions than the plurality of antenna elements, and
wherein the number of the connected passive reflector resonance circuits is greater than that of the number of the antenna elements of the plurality of antenna elements.

10. The magnetic resonance device as claimed in claim 1, wherein the antenna arrangement is configured as a receiving antenna arrangement.

11. The magnetic resonance device as claimed in claim 1, wherein the high-frequency shield system has at least one additional high-frequency shield between the reflector array and the gradient coil system.

12. The magnetic resonance device as claimed in claim 1, wherein the antenna arrangement and the reflector array are arranged in a cryostat container.

13. The magnetic resonance device as claimed in claim 2, wherein the reflector array has passive reflector resonance circuits of the plurality of passive reflector resonance circuits separated from one another.

14. The magnetic resonance device as claimed in claim 3, wherein the reflector array has passive reflector resonance circuits of the plurality of passive reflector resonance circuits separated from one another.

15. The magnetic resonance device as claimed in claims 2, wherein the reflector array comprises a network of connected passive reflector resonance circuits of the plurality of passive reflector resonance circuits.

16. The magnetic resonance device as claimed in claims 3, wherein the reflector array comprises a network of connected passive reflector resonance circuits of the plurality of passive reflector resonance circuits.

17. The magnetic resonance device as claimed in claim 8, wherein the connected passive reflector resonance circuits have smaller dimensions than the plurality of antenna elements, and
wherein the number of the connected passive reflector resonance circuits is greater than that of the number of the antenna elements of the plurality of antenna elements.

18. The magnetic resonance device as claimed in claim 9, wherein the antenna arrangement is configured as a receiving antenna arrangement.

19. A reflector array for a high-frequency shield system of a magnetic resonance device, the reflector array comprising:
a plurality of passive reflector resonance circuits, each passive reflector resonance circuit of the plurality of passive reflector resonance circuits being configured such that resonance frequencies of the plurality of passive reflector resonance circuits lie below an operating magnetic resonance frequency of the magnetic resonance device and that the plurality of passive reflector resonance circuits has an inductive overall impedance.

20. A high-frequency shield system for a magnetic resonance device, the magnetic resonance device comprising:
a measurement chamber;
an antenna arrangement comprising a plurality of antenna elements arranged at least in areas around the measurement chamber; and
a gradient coil system arranged outside the antenna arrangement as viewed from the measurement chamber,
wherein the high-frequency shield system is arranged between the antenna arrangement and the gradient coil system, and
wherein the high-frequency shield system comprises a reflector array having a plurality of passive reflector resonance circuits, each passive reflector resonance circuit of the plurality of passive reflector resonance circuits being designed such that resonance frequencies of the plurality of passive reflector resonance circuits lie below an operating magnetic resonance frequency of the magnetic resonance device and that the plurality of passive reflector resonance circuits has an inductive overall impedance.

* * * * *